United States Patent [19]

Schalk

[11] 4,266,147
[45] May 5, 1981

[54] CIRCUIT ARRANGEMENT FOR FORMING A SPEED-PROPORTIONAL OUTPUT VOLTAGE FROM A SPEED-PROPORTIONAL PULSE SEQUENCE

[75] Inventor: Karl Schalk, Nuremberg, Fed. Rep. of Germany

[73] Assignee: Siemens Aktiengesellschaft, Berlin and Munich, Fed. Rep. of Germany

[21] Appl. No.: 939,281

[22] Filed: Sep. 5, 1978

[30] Foreign Application Priority Data

Sep. 9, 1977 [DE] Fed. Rep. of Germany ....... 2740771

[51] Int. Cl.³ .................. G06G 7/12; G01P 3/48; H03K 17/60
[52] U.S. Cl. .................................. 307/492; 307/246; 307/585; 324/168; 324/173
[58] Field of Search .............. 307/246, 229, 230, 293, 307/251; 324/163, 598, 173; 364/852

[56] References Cited

U.S. PATENT DOCUMENTS

| 3,109,140 | 10/1963 | Chin et al. | 324/168 |
| 3,264,496 | 8/1966 | Scholl | 324/168 |
| 3,800,234 | 3/1974 | Myren | 307/246 |
| 4,068,136 | 1/1978 | Mename | 307/229 |

Primary Examiner—Stanley D. Miller, Jr.
Assistant Examiner—B. P. Davis
Attorney, Agent, or Firm—Kenyon & Kenyon

[57] ABSTRACT

Input variables are varied cyclically and sequentially in the same direction until the sign of the differential quotient of the magnitude of the error with respect to time changes.

13 Claims, 4 Drawing Figures

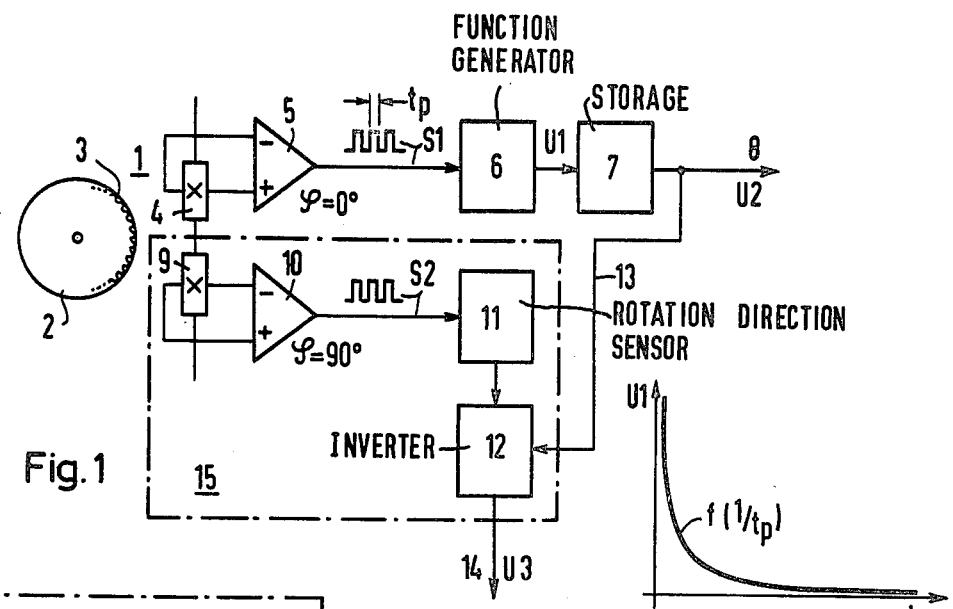
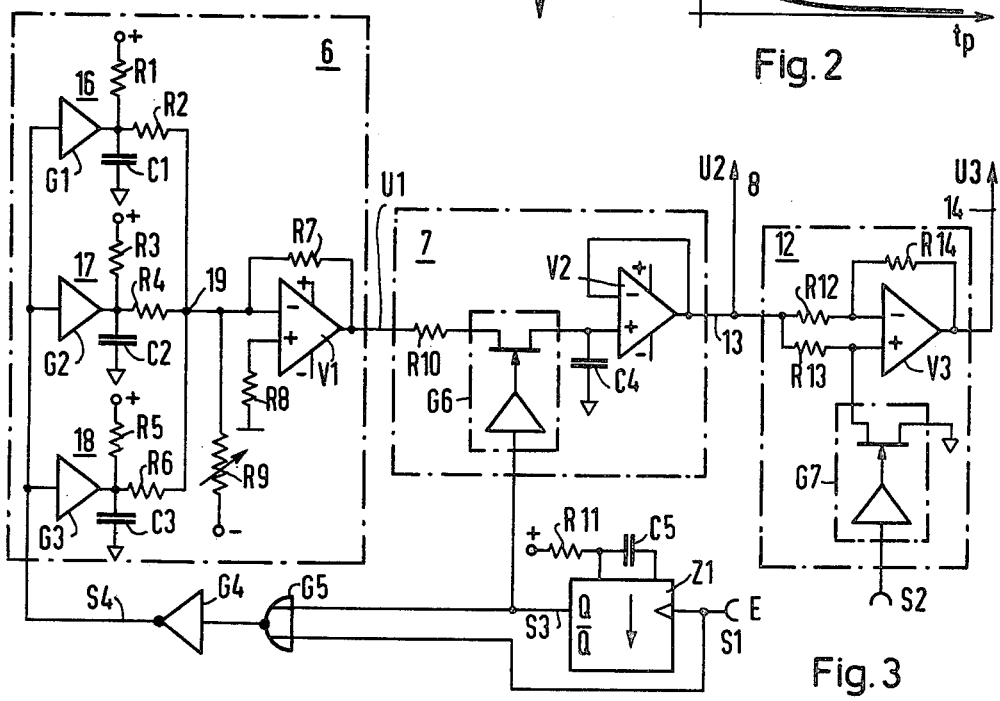
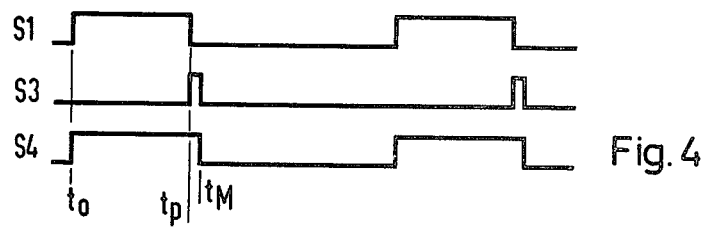

CIRCUIT ARRANGEMENT FOR FORMING A SPEED-PROPORTIONAL OUTPUT VOLTAGE FROM A SPEED-PROPORTIONAL PULSE SEQUENCE

BACKGROUND OF THE INVENTION

This invention relates to a circuit arrangement for forming a speed-proportional output voltage from a speed-proportional pulse sequence.

It is known to obtain a speed-proportional d-c voltage from a speed-proportional pulse sequence by causing the pulses of the speed-proportional pulse sequence to trigger a time delay stage having constant voltage amplitude and duration and by integrating the voltage-time areas so formed. Since the time constant of the timing member of the time delay stage must be selected according to the highest speed to be measured, the output voltage obtained in this manner will have more or less ripple. Where, however, the speed control system has a wide speed setting range, such an output voltage is not suitable as the actual voltage value. One is therefore compelled to use other actual value speed generators in which the ripple of the output voltage is practically zero, in cases where a speed control system having a wide speed setting range is needed. This property is exhibited, for instance, by d-c commutator motors which are customarily used as actual value speed generators in speed controlled drives with analog control and manipulated variable inputs. D-c commutator motors have the disadvantage, however, that the life and the measuring accuracy especially at high speeds, decline very strongly due to brush wear. This disadvantage may be avoided by using brushless d-c motors. These, however, require much circuitry for the commutator, and the output voltage likewise has much ripple.

SUMMARY OF THE INVENTION

It is an object of this invention to provide a circuit arrangement of the type mentioned above which, while being of high measuring accuracy, can keep ripple in the output voltage practically at zero. The measuring accuracy is thus essentially determined by the resolution of the encoding disc used for generating the pulses of the pulse sequence. According to the invention, the circuit provides a speed-proportional output voltage which is derived from the pulse width tp (pulse duration) of the pulse sequence by means of a function generator, i.e., a pulse duration converter forming a function 1/tp. The function 1/tp can be formed in a simple manner by superimposition of several exponential functions having different time constants. It has been found that sufficient accuracy is readily obtained by superposition of three exponential functions.

BRIEF DESCRIPTION OF THE DRAWINGS

FIG. 1 is a block diagram of an embodiment of the invention.

FIG. 2 is a plot of the function 1/tp.

FIG. 3 is a schematic diagram of a function generator, interim storage, and signal inverter suitable for use in the embodiment of FIG. 1.

FIG. 4 illustrates the timing relationship between speed proportional input pulses, speed proportional voltage sampling pulses, and function generator input gating pulses.

DETAILED DESCRIPTION OF THE INVENTION

FIG. 1 shows a device 1 for generating a speed proportional pulse sequence. The generator 1 may be of a convenient design operating according to a magnetic, inductive, galvanomagnetic or optical principle. In the embodiment of FIG. 1, a galvanomagnetic pickup system is shown in which a magnet disc 2 has magnetized teeth or a magnetization corresponding to them on its circumference 3. The magnetization 3 is arranged so that north and south poles occur in alternation. The magnetization 3 acts on a Hall generator 4 which is followed by an amplifier 5 whose output is a series of square-wave pulses S1. In the example chosen, the pulse width (pulse duration) tp has the width of a pulse interval. The pulses S1 are fed to a function generator 6, which delivers a voltage U1 proportional to a/tp at its output. In the interim storage stage 7 connected to the function generator 6, the voltage pulses S1, which are delivered by the function generator 6 and which are inversely proportional to the pulse width tp, are stored and made available at the output 8 as voltage U2. The voltage U2 is proportional to the magnitude of the speed.

A second Hall generator 9 is associated with magnet disc 2 so that the direction of rotation can also be ascertained. The Hall generator 9 is shifted 90° electrically relative to the Hall generator 4. The pulses delivered by the Hall generator 9 are converted in the same manner as before, via an amplifier 10, into signal pulses S2, shifted in phase 90° relative to the pulses S1. The box marked 11 indicates a device for recognizing the direction of rotation; such devices are well known in the art and therefore need not be described specifically. The rotation direction recognizing device 11 drives an inverter 12 which is connected via line 13 to the output of the interim storage or holding stage 7. At the output 14 of the inverter 12, a voltage U3 which is proportional to the speed as well as to the direction of rotation of the magnet disc 2 can be taken off. The elements framed by the dash-dotted lines and designated 15 are required only if the speed-proportional output voltage is also to indicate the direction of the rotation by a corresponding polarity.

As set forth above, the output pulses S1 of the pulse generator 1 are fed to the function generator 6. The pulse width tp of the pulses S1 is inversely proportional to the speed of rotation n of the drive coupled to the magnet disc 2: $tp \sim 1/n$; $n \sim 1/tp \sim U_1$.

The function generator 6 furnishes an output voltage U1 which is inversely proportional to the pulse width tp and directly proportional to the speed of rotation n. To obtain a speed-dependent output voltage U1, the output of pulse generator must be divided by the pulse width tp. An exact divider circuit for this purpose is very expensive to build.

According to the present invention, the problem is solved by forming the function 1/tp by superposition of several exponential functions having different time constants. It is self-evident that this function can be simulated more exactly by using a large number of exponential functions. It has been found, however, that the function 1/tp can be simulated with sufficient accuracy by superposition of only three exponential functions. The function 1/tp is shown in FIG. 2, where the pulse width tp is plotted on the abscissa axis and the voltage U1 on the ordinate axis. U1, of course, is proportional to the speed of rotation n.

As shown in FIG. 3, the three exponential functions are formed by R-C networks 16, 17 and 18. These three exponential functions have different time constants τ1, τ2 and τ3. τ1 is determined by the two resistors R1 and R2 and the capacitor C1; τ2 is determined by the two resistors R3 and R4 and the capacitor C2; and τ3 is determined by the two resistors R5 and R6 and the capacitor C3. The resistors R1, R3 and R5 form the charging resistors and are connected to the positive supply voltage; the resistors R2, R4 and R6 are discharging resistors. They are tied together at a current summing point 19 at the inverting input of an amplifier V1. The R-C networks 16, 17 and 18 are addressed via gates G1, G2 and G3 which control whether the capacitors C1, C2 and C3 are to be charged or discharged. The gates used are preferably of the CMOS type with open drain outputs; these have the advantage that, due to the CMOS structure, additional current limiting resistors for the discharge current are not necessary.

The gates G1 to G3 are driven via gates G4 and G5 on the one hand directly by the signals S1 as well as also indirectly via a time delay stage Z1, i.e., a one shot multivibrator. If no signal S1 is present, the input of the NOR gate G5 is zero and a "1" signal then appears at its output. Since the gate G4 is an inverting stage, the output of this gate has a "0" signal. A "0" signal for the gates G1 to G3 means that the tie point of the R-C network 16 to 18 is connected to zero potential so that the capacitors C1 to C3 are practically short circuited. The current summing point 19 is then approximately at zero potential. If an input pulse 31 now appears at the input E, this also appears at the output of the gate G4, so that the gates G1 to G3 are opened so that the capacitors C1 to C3 are charged via the resistors R1, R3 and R5, respectively. The charging time is determined by the duration or pulse width of the input pulses. The charging voltages of the capacitors C1 to C3 are converted, by the resistors R2, R4 and R6, respectively, into currents and fed to the current summing point 19 at the input of the amplifier VI.

The inverting input of the amplifier VI is connected via a variable resistor R9 to the negative pole of the supply voltage U. The noninverting input of the amplifier VI is connected via a resistor R8 to the ground. Therefore resistor R9 biases the summing point 19 negatively such that the exponentially rising voltage from the R-C circuits 16, 17 and 18, which without such bias would appear inverted and, thus, negative, appears at the output of the amplifier V1 as a voltage decaying in time, $U1 \sim 1/tp$ as shown on FIG. 2. This output voltage of the function generator 6 is sampled and stored in the connected holding or interim storage stage 7 at the end of each one measuring cycle. The output voltage U2 of the holding stage 7 thus corresponds to the magnitude of the instantaneous value n of the speed of rotation. This is accomplished by means of time delay stage Z1 which is activated by the falling edge of the input pulse S1. At this time, a pulse S3 having a width determined by a resistor R11 and a capacitor C5 is delivered at output Q, as can be seen in FIG. 4. The output pulse S3 of the time delay stage Z1 switches an FET analog switch G6 briefly into the conducting state, so that the capacitor C4 is charged via the resistor R10 with a time constant $\tau4 = R10 \times C4$ to the output voltage U1 from the amplifier VI. When the FET analog switch G6 is then cut off, the voltage across the capacitor C4 corresponds to the instantaneous value of the speed n. The voltage across the capacitor C4 is fed to the noninverting input of the amplifier V2, which, in effect, by operating as an impedance transformer, maintains a low discharge rate of capacitor C1 while making the capacitor voltage U2 of the capacitor C4 available at low impedance at the output of amplifier V2. The speed-proportional voltage U2 can be taken off via the line 8.

To prevent discharge of, the capacitors C1 to C3 during sampling by the pulses S3, the pulse width of the input pulses S1 is stretched by the gate G5 for the width of the scanning pulses S3. As shown in FIG. 4, the measuring time $t_M$ (measuring pulse S4) is composed of the pulse width tp plus the width of the scanning pulse S3. During this time, the capacitors C1 to C3 are charged. During the following pulse gap, the capacitors C1 to C3 are discharged again by means of the gates G1 to G3. With the next pulse S1 at the input E, the events described repeat. The influence of the scanning pulses S3 on the measuring accuracy can usually be ignored, since, as a rule, the scanning pulse S3 is of considerably shorter duration than the pulse S1.

In order to also take the direction of rotation into consideration the polarity of the output voltage of the amplifier V2 can be charged by means of the inverter 12, depending on the instantaneous direction of rotation. The inverter 12 is provided with an amplifier V3 to both inputs of which the output voltage U2 of the amplifier V2 is applied via connecting line 13 and resistors R12 and R13. The output of the amplifier V3 is connected to the inverting input via a resistor R14 of the same resistance as the resistors R12 and R13. The noninverting input of the amplifier V3 is connected to ground via an FET analog switch G7. The switch G7 is controlled by the signal S2 as shown in FIG. 1. If the signal S2 is present, then the switch G7 is not closed and the signal S2 is applied to both inputs of the amplifier V3; the input signal U2 on the line 13 then appears unchanged at the output 14 and the amplifier V3 operates in a non-inverting manner. However, as soon as the output signal S2 disappears, the switch G7 closes and connects the noninverting input to ground. The amplifier then operates as an inverting amplifier so that an inverted signal appears at the output 14 of the amplifier V3. Since the gain is V=1 in both cases, the amplitude of the output signal U3 is the same in both cases, being proportional to the speed of rotation n, but indicating the direction of rotation by the polarity of the voltage U3. The polarity of the output voltage of the amplifier V3 is thus determined by the signal S2.

What is claimed is:

1. A circuit arrangement for forming a speed-proportional DC output voltage from a speed-proportional sequence of rectangular pulses comprising:
   a pulse duration converter having an input for receiving the speed-proportional pulse sequence and including a plurality of R-C networks coupled to the input to respond simultaneously to the pulse sequence, each network having at least one resistor and one capacitor and a different time constant and each being adapted to form a signal which is a different exponential function of the input signal; and
   means for superposing the signals of the R-C networks to form an output voltage which is inversely proportional to the pulse duration.

2. The circuit arrangement of claim 1, and further including means to control the charging of the capacitors in said R-C networks as a function of the pulse duration in the pulse sequence.

3. The circuit arrangement of claim 2 wherein said means to control the charging of the capacitors of the R-C networks comprise gates having as inputs the pulses of the pulse sequence.

4. The circuit arrangement of claim 3, wherein said gates comprise CMOS gates having open drain outputs shunted across the capacitors of the R-C networks and wherein the R-C networks are coupled across a source of constant voltage.

5. The circuit arrangement of claim 4 and further including:
   (a) and operational amplifier having inverting and non-inverting inputs, said operational amplifier having a feedback resistor coupled between its output and its inverting input;
   (b) a plurality of input resistors, one for each of said R-C networks having one end coupled to the junction point between a resistor and capacitor in a respective R-C network, the other ends of said resistors coupled to a common summing point which is also coupled to the inverting input of said amplifier; and
   (c) a resistor coupled between said common summing point and a negative potential, said resistor and negative potential being selected so as to bias said summing point such that the essentially exponentially rising voltage obtained from said capacitors will appear at the output of said amplifier as a voltage decaying in time.

6. The circuit arrangement according to claim 5 and further including a storage stage coupled to the output of said amplifier for sampling and storing the output of said amplifier at the end of each pulse width measurement.

7. The circuit arrangement according to claim 6 wherein said storage comprises:
   a capacitor, said capacitor having one end coupled to ground;
   a switch having its output terminal coupled to the other terminal of said capacitor;
   a resistor coupling the input terminal of said switch to the output of said amplifier; and
   means for briefly closing said switch at the end of each pulse width measurement.

8. The circuit arrangement according to claim 7 wherein said switch comprises a solid state switch and wherein said means for briefly closing said switch comprises a time delay member having as firing inputs the falling edges of the pulses of said pulse sequence.

9. The circuit arrangement according to claim 10 wherein said time delay member provides an output having a duration which is short as compared to the width of the pulses of said pulse sequence.

10. The circuit arrangement according to claim 9 and further including means to supply, as pulses controlling said gates which control the charging of said capacitors, a pulse which has a width equal to the width of the pulses of said pulse sequence plus the width of said pulse provided by said time delay member.

11. The circuit arrangement according to claim 10 and further including an amplifier coupled as a pulse transformer having its input coupled to the other terminal of said storage capacitor.

12. The circuit arrangement according to claim 11 and further including a controllable inverter having as an input the output of said storage means; and means to control said inverter in dependence on the direction of rotation of said speed-proportional pulse sequence, whereby at the output of said inverter a signal having a magnitude proportional to the speed of the pulse sequence and a polarity representing the direction will be provided.

13. The circuit arrangement according to claim 12 wherein said inverter comprises: an amplifier having inverting and non-inverting inputs; input resistors of equal magnitude coupling the output of said storage stage to both said inverting and non-inverting inputs; a feedback resistor coupled between the output of said amplifier and its inverting input; a controllable switch coupling said non-inverting input to ground; and means to supply a control signal to said switch in dependence on the direction of rotation.

* * * * *